(12) United States Patent
Tsai et al.

(10) Patent No.: US 7,755,596 B2
(45) Date of Patent: Jul. 13, 2010

(54) DRIVING DEVICE WITH LIGHT SENSOR MODULE AND ELECTRONIC DEVICE USING THE SAME

(75) Inventors: Cheng-Chueh Tsai, Shenzhen (CN); Fu-Tsun Shih, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1002 days.

(21) Appl. No.: 11/309,428

(22) Filed: Aug. 4, 2006

(65) Prior Publication Data

US 2007/0200817 A1    Aug. 30, 2007

(30) Foreign Application Priority Data

Feb. 24, 2006    (TW) .............................. 95106261 A

(51) Int. Cl.
*G09G 3/36* (2006.01)
*G02F 1/1335* (2006.01)

(52) U.S. Cl. ........................................ 345/102; 349/62
(58) Field of Classification Search ................... 345/84, 345/87–102; 349/61–71
See application file for complete search history.

(56) References Cited

U.S. PATENT DOCUMENTS

| 4,962,395 A | * | 10/1990 | Baird | .......................... 340/619 |
| 6,812,649 B2 | | 11/2004 | Kim | |
| 7,394,186 B2 | * | 7/2008 | Kim | ............................ 313/46 |

FOREIGN PATENT DOCUMENTS

| CN | 1652340 A | 8/2005 |
| JP | 2003-78838 A | 3/2003 |
| TW | M276322 | 9/2005 |

\* cited by examiner

*Primary Examiner*—Srilakshmi K Kumar
(74) *Attorney, Agent, or Firm*—Wei Te Chung

(57) ABSTRACT

A driving device (30) with a light sensor module (32) includes a circuit board (31), and a first light sensor hole (34). The light sensor module is electrically connected to a surface of the circuit board, and includes a chip carrier (320), a potting compound (322), and a light sensor chip (321). The light sensor hole is defined in the circuit board below the light sensor chip. The chip carrier is electrically connected to the circuit board. The potting compound has a top potting compound (322A) and a bottom potting compound (322B) with the chip carrier disposed therebetween. The light sensor chip is electrically connected to the chip carrier and covered with the bottom potting compound.

11 Claims, 5 Drawing Sheets

DRIVING DEVICE WITH LIGHT SENSOR MODULE AND ELECTRONIC DEVICE USING THE SAME

FIELD OF THE INVENTION

The invention relates to electronic driving devices, and particularly to a driving device with a light sensor module for driving a light source module such as discharge lamps of a liquid crystal display (LCD) panel.

DESCRIPTION OF RELATED ART

Conventionally, portable electronic devices, such as notebook computers and personal digital assistances (PDAs), have liquid crystal display (LCD) panels that use discharge lamps or other lamps of a backlight module as light sources. Backlight control devices in the backlight module drive the light sources and regulate brightness thereof according to external light intensity.

Normally, a light sensor device of the backlight control device senses intensity of the external light, and a driving device of the backlight control device regulates brightness thereof according to the sensed external light intensity. In a conventional LCD, the light sensor device is separated from the driving device, that is, the light sensor device is not integrated with the driving device, thereby increasing the cost and size of the electronic device.

SUMMARY OF THE INVENTION

An exemplary embodiment of the invention provides a driving device with a light sensor module. The driving device includes a circuit board, and a first light sensor hole. The light sensor module is electrically connected to a surface of the circuit board, and includes a chip carrier, a potting compound, and a light sensor chip. The first light sensor hole is defined in the circuit board below the light sensor chip. The chip carrier is electrically connected to the circuit board. The potting compound has a top potting compound and a bottom potting compound. The chip carrier is disposed between the top potting compound and the bottom potting compound. The light sensor chip is electrically connected to the circuit board and covered with the bottom potting compound.

Another exemplary embodiment of the invention provides a driving device with a light sensor module. The driving device includes a circuit board. The light sensor module is electrically connected to a surface of the circuit board, and includes a chip carrier and a light sensor chip. The chip carrier is electrically connected to the circuit board. The light sensor chip is electrically connected to the chip carrier.

Another exemplary embodiment of the invention provides an electronic device. The electronic device includes a display device, a driving device, and a light sensor window. The driving device is disposed behind the display device, and includes a circuit board and a light sensor module. The light sensor module is electrically connected to a surface of the circuit board, and includes a chip carrier and a light sensor chip. The chip carrier is electrically connected to the circuit board, and the light sensor chip is electrically connected to the chip carrier. The light sensor window is disposed at the bottom of the display device and corresponds to the light sensor chip.

Other advantages and novel features will become more apparent from the following detailed description of preferred embodiments when taken in conjunction with the accompanying drawings, in which:

DETAILED DESCRIPTION OF THE INVENTION

Figure 1:
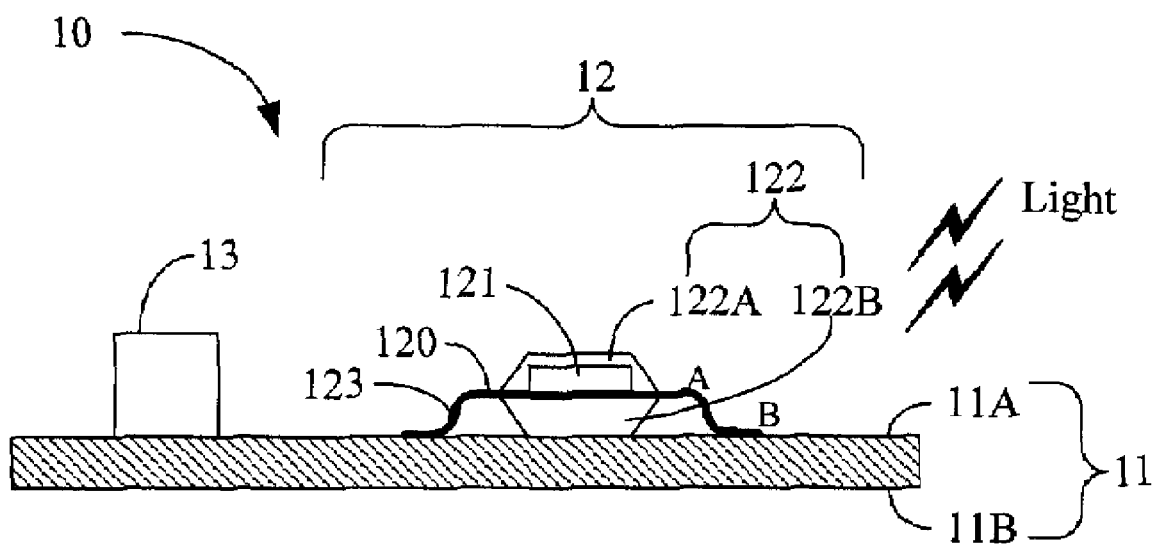
FIG. 1 is a cross-sectional view of a part of a circuit board of a driving device of a first exemplary embodiment of the present invention.

FIG. 1 is a cross-sectional view of part of a circuit board 11 of a driving device 10 of a first exemplary embodiment of the present invention. The driving device 10, disposed in a liquid crystal display (LCD) device to drive a light source like discharge lamps or other lamps, includes a circuit board 11, a light sensor module 12, and at least one electronic component 13. The circuit board 111 has a top surface 11A and a bottom surface 11B. The light sensor module 12 is electrically connected to the top surface 11A of the circuit board 11. In the exemplary embodiment, the light sensor module 12 includes a chip carrier 120, a light sensor chip 121, a potting compound 122, and a plurality of pins 123.

The chip carrier 120 of the light sensor module 12 is electrically connected to the circuit board 11, and carriers the light sensor chip 121 thereon. In the exemplary embodiment, the chip carrier 120 can be a substrate, or a lead frame.

The potting compound 122 includes a top potting compound 122A above the chip carrier 120, and a bottom potting compound 122B below the chip carrier 120 and above the circuit board 11. In addition, the top potting compound 122A and the bottom potting compound 122B are integrated into the potting compound 122, and materials thereof are transparent.

In the exemplary embodiment, the light sensor chip 121, set above the chip carrier 120, is electrically connected to the chip carrier 120. That is, the light sensor chip 121 is covered with the top potting compound 122A. Each pin 123 has an input A and an output B. In the exemplary embodiment, the pins 123 are bent. Inputs A are electrically connected to the chip carrier 120 and outputs B are electrically connected to the circuit board 11.

In the exemplary embodiment, the electronic component 13 can be an integrated circuit (IC), a resistor, a capacitor, a transformer or some other component, and is electrically connected to the circuit board 11. In addition, height of the electronic component 13 may be greater than that of the light sensor module 12, or less than that of the light sensor module 12.

In the exemplary embodiment, the electronic component 13 and the light sensor module 12 are mounted to the same surface, such as the top surface 11A of the circuit board 11. The height of the electronic 13 is greater than that of the light sensor module 12. The light sensor module 12 is defined as a front light sensor module, since the light sensor module 12 senses external light intensity via the top surface 11A of the circuit board 11.

Figure 2:
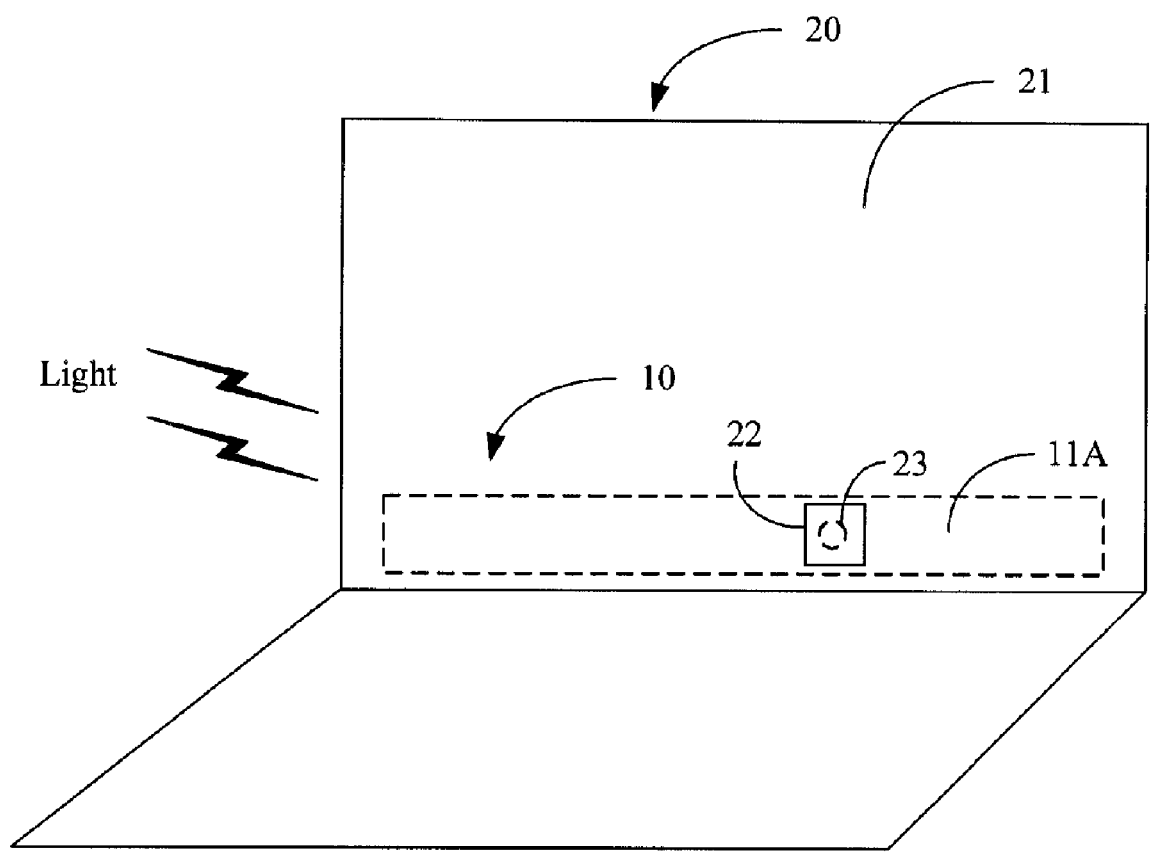
FIG. 2 is a schematic diagram of an application environment of FIG. 1.

FIG. 2 a schematic diagram of an application environment of FIG. 1. The driving device 10 is disposed in an LCD 21 of an electronic device like a notebook 20, for driving backlight, such as discharge lamps or other lamps, of the LCD 21. The driving device 10 is disposed behind an LCD panel (not shown) of the LCD 21 near a bottom of the LCD panel, which defines a display surface facing users of the electronic device. The LCD 21 further comprises a light sensor window 22 that is disposed at the bottom of the LCD panel and corresponding to the light sensor chip 121 of the light sensor module 12 of the driving device 10. In the exemplary embodiment, the material of the light sensor window 22 comprises glass.

The height of the electronic component 13 is greater than the light sensor module 12. Because there is a difference between the heights of the light sensor module 12 and the LCD panel of the LCD 21, a cylindrical shaped light pipe 23 made of transparent material is embedded between the light sensor module 12 and the LCD panel of the LCD 21. In alternative embodiments, the light pipe 23 can be other shape. Therefore, the light sensor chip 121 of the light sensor module 12 senses external light intensity via the light sensor window 22 through the light pipe 23, and thus the driving device 10 can regulate the brightness of the LCD 21 according to the sensed external light intensity.

Figure 3:
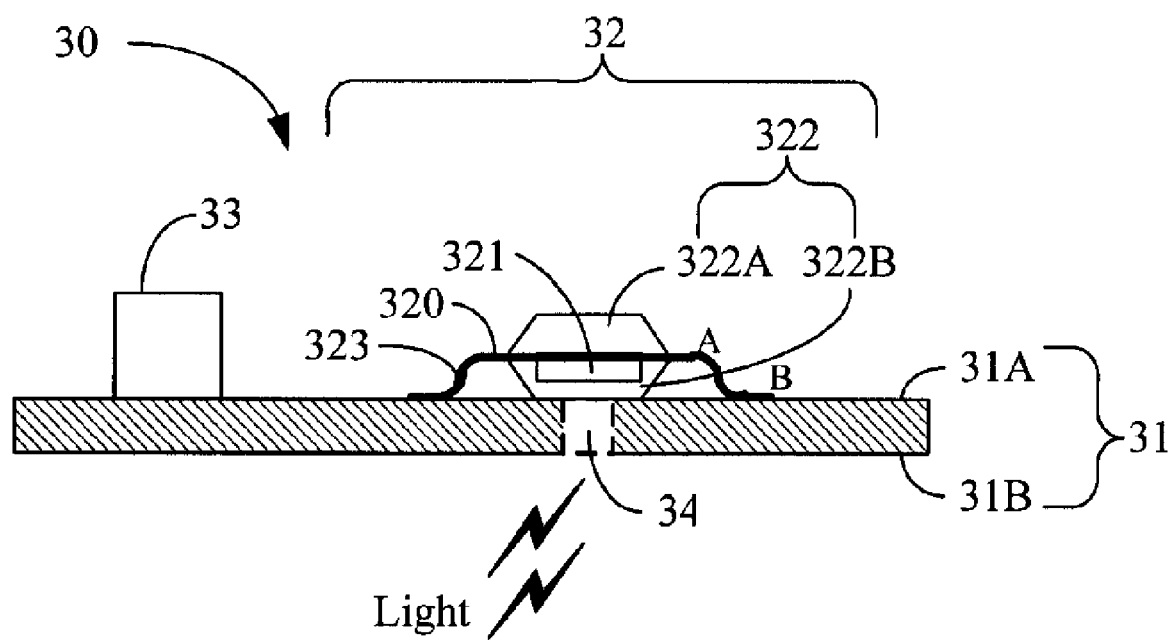
FIG. 3 is a cross-sectional view of a part of a circuit board of a driving device of a second exemplary embodiment of the present invention.

FIG. 3 is a cross-sectional view of a part of a circuit board of a driving device 30 of a second exemplary embodiment of the present invention. The driving device 30 shown in FIG. 3 is substantially the same as that of the driving device 10 in FIG. 1, except that a light sensor chip 321, electrically connected to a chip carrier 320, is covered with a bottom potting compound 322B. In the exemplary embodiment, a light sensor module 32 is a back light sensor module, since the light sensor module 32 senses external light intensity via a bottom surface 31B of the circuit board 31. A light sensor hole 34 is defined in the circuit board 31 corresponding to the light sensor chip 321, thus, the light sensor chip 321 senses external light intensity via the light sensor hole 34. In the exemplary embodiment, light is guided to the light sensor chip 321 via the light sensor hole 34 defined in the bottom surface 31B of the circuit board 31.

Figure 4:
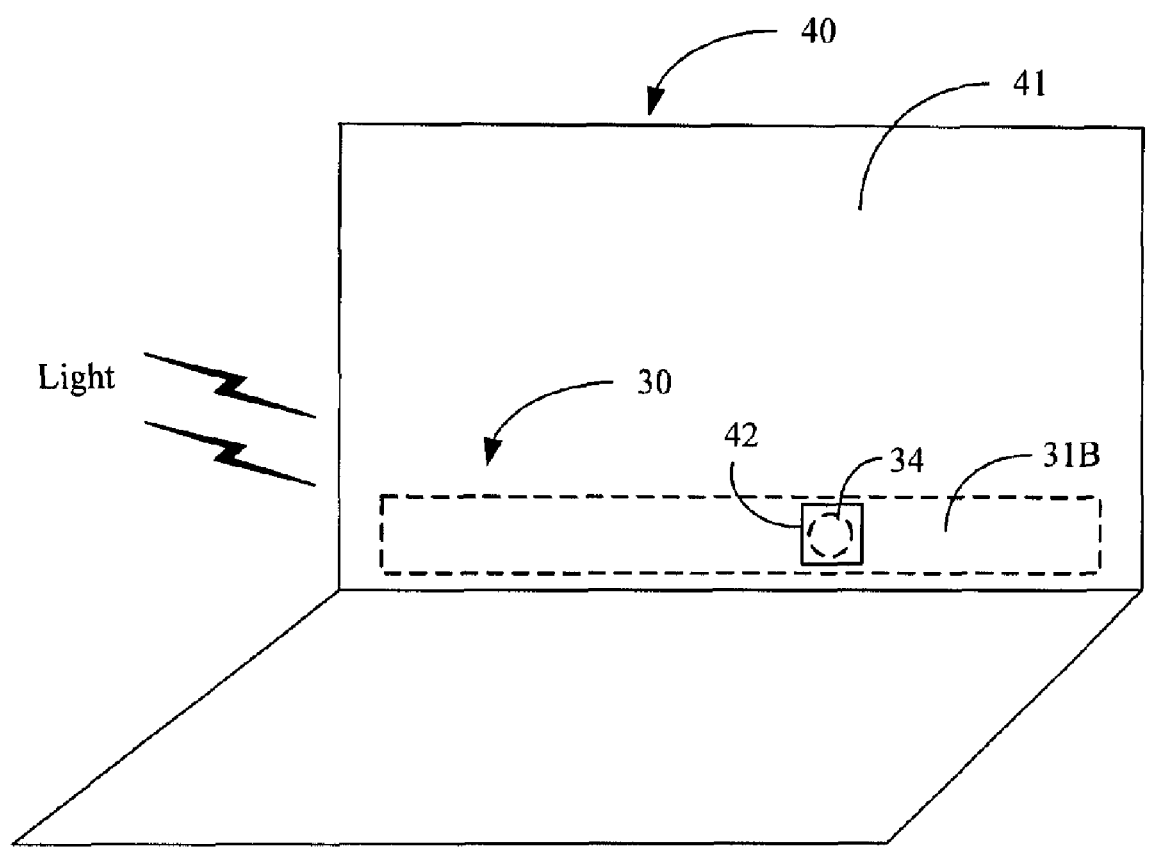
FIG. 4 is a schematic diagram of an application environment of FIG. 3.

FIG. 4 a schematic diagram of an application environment of FIG. 3. The application environment of the driving device 30 is substantially the same as that of FIG. 2, except that the bottom surface 31B of the circuit board 31, that is a surface having no component, abuts against the LCD panel. Similarly, a light sensor window 42 is disposed at the bottom of the LCD panel corresponding to the light sensor hole 34. Therefore, the light sensor chip 321 senses external light intensity directly via the light sensor hole 34.

Figure 5:
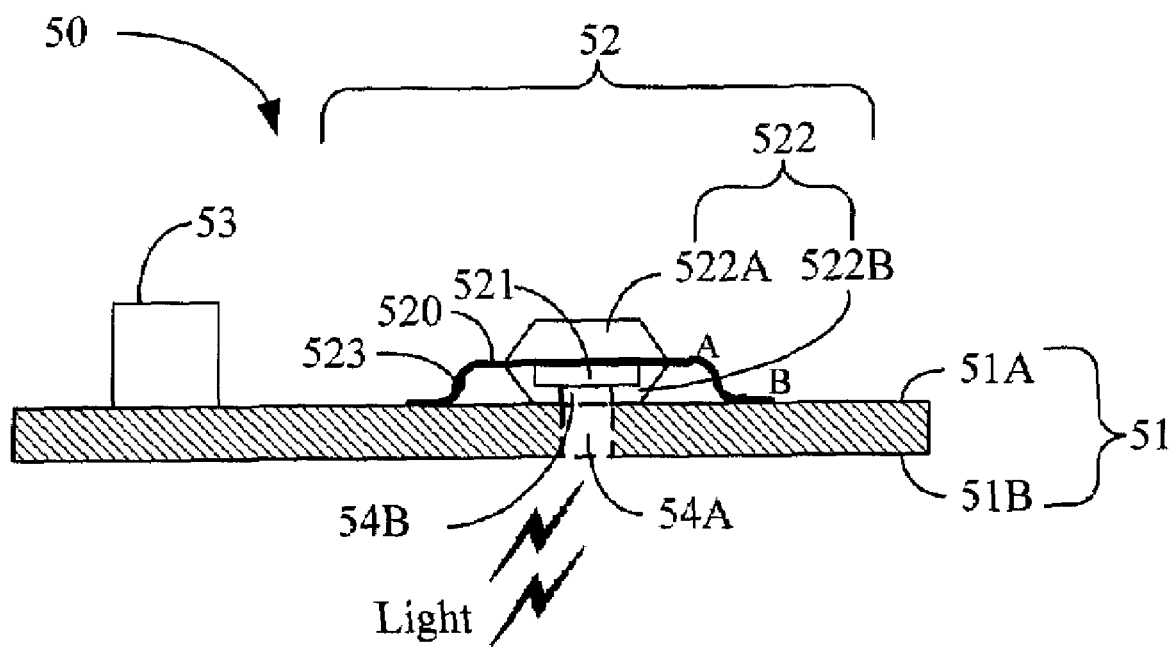
FIG. 5 is a cross-sectional view of a part of a circuit board of a driving device of a third exemplary embodiment of the present invention.

FIG. 5 is a cross-sectional view of part of a circuit board of a driving device 50 in a third exemplary embodiment of the present invention. The driving device 50 in FIG. 5 is substantially the same as that of the driving device 30 in FIG. 3, except that another light sensor hole 54B in communication with the light sensor hole 54A is defined in the bottom potting compound 522B. In the exemplary embodiment, the light sensor chip 521 senses external light intensity via the light sensor hole 54A and 55B via the bottom potting compound 522B. An application environment of the driving device 50 is the same as that of FIG. 4, and thus description thereof is omitted.

In the present invention, the light sensor module that senses the external light intensity by a front surface or a back surface is integrated into the driving device. Therefore, an electronic device using the driving device is smaller and has lower cost.

While embodiments and methods of the present invention have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. An electronic device comprising:
a display device defining a display surface along a side thereof for display;
a light source installable in said display device for illuminating said display surface of said display device for said display;
a driving device installable in said display device beside said light source for driving illumination of said light source, said driving device comprising a circuit board and electronic components mounted on a first surface of said circuit board to function for said driving device, said circuit board disposed in said display device by means of a selective surface of said circuit board facing said display surface of said display device; and
a light sensor module electrically connectable to said circuit board on said first surface of said circuit board beside said electronic components, said light sensor module comprising a light sensor chip packaged therein and able to sense external light outside said display device through said display surface with help of said selective surface of said circuit board;
wherein said selective surface of said circuit board is a second surface of said circuit board opposite to said first surface and said light sensor chip senses said external light via a light sensor hole defined in said circuit board communicating said first surface with said second surface of said circuit board when said light sensor module is mounted on said first surface of said circuit board.

2. The driving device as claimed in claim 1, wherein said selective surface of said circuit board is said first surface of said circuit board and said light sensor chip senses said external light by directly mounting on said first surface.

3. A driving device with a light senor module for driving a light source module, comprising:
a circuit board;
a light sensor module electrically connected to a surface of the circuit board, comprising:
a chip carrier electrically connected to the circuit board; and
a light sensor chip electrically connected to the chip carrier;
a potting compound having a top potting compound and a bottom potting compound, and the chip carrier disposed therebetween, wherein the light sensor chip is electrically connected to the chip carrier and covered by the bottom potting compound; and
a first light sensor hole defined in the circuit board below the light sensor chip.

4. The driving device as claimed in claim 3, wherein the light sensor module comprises a plurality of pins for electrically connecting the chip carrier to the circuit board.

5. The driving device as claimed in claim 3, wherein the bottom potting compound comprises a second light sensor hole in communication with the first light sensor hole.

6. The driving device as claimed in claim 3, wherein the light sensor chip is electrically connected to the chip carrier and covered with the top potting compound.

7. An electronic device, comprising:
a display device; and
a driving device for driving a light source module disposed behind the display device, comprising:
a circuit board;
a light sensor module electrically connected to the circuit board, comprising:

a chip carrier electrically connected to the circuit board; and a light sensor chip electrically connected to the chip carrier; and a light sensor window disposed at the bottom of the display device and corresponding to the light sensor chip;

a potting compound having a top potting compound and a bottom potting compound, and the chip carrier disposed therebetween, wherein the light sensor chip is electrically connected to the chip carrier and covered with the top potting compound;

a light pipe embedded with the display device and the light sensor module, for guiding external light intensity to the light sensor module.

8. The electronic device as claimed in claim 7, wherein the light sensor module comprises a plurality of pins for electrically connecting the chip carrier to the circuit board.

9. The electronic device as claimed in claim 7, wherein the light sensor chip is electrically connected to the chip carrier and covered with the bottom potting compound.

10. The electronic device as claimed in claim 9, wherein the driving device comprises a first light sensor hole defined in the circuit board below the light sensor chip.

11. The electronic device as claimed in claim 10, wherein the bottom potting compound comprises a second light sensor hole in communication with the first light sensor hole.

* * * * *